US005400410A

United States Patent [19]

Muraki et al.

[11] Patent Number: 5,400,410

[45] Date of Patent: Mar. 21, 1995

[54] SIGNAL SEPARATOR

[75] Inventors: Kenji Muraki, Osaka; Kouji Watanabe, Hirakata; Nobuyuki Ogawa, Takatsuki; Tatsuhiko Numoto, Osaka, all of Japan

[73] Assignee: Matsushita Electric Industrial Co., Ltd., Osaka, Japan

[21] Appl. No.: 160,192

[22] Filed: Dec. 2, 1993

[30] Foreign Application Priority Data

Dec. 3, 1992 [JP] Japan .................................. 4-323920
Apr. 6, 1993 [JP] Japan .................................. 5-079304

[51] Int. Cl.$^{6}$ ............................................... H03G 3/00
[52] U.S. Cl. ....................................... 381/107; 381/28
[58] Field of Search .............................. 381/1, 28, 107

[56] References Cited

U.S. PATENT DOCUMENTS 5,287,789 2/1994 Zimmerman ..................... 84/477 R

*Primary Examiner*—Forester W. Isen
*Attorney, Agent, or Firm*—Wenderoth, Lind & Ponack

[57] ABSTRACT

In an apparatus for reproducing media having a channel 1 including only accompanied signals and a channel 2 including accompanied signals and song signals, a song signal separator which includes a gain adjusting means for inputting signals of a channel 1, a subtracting means for subtracting the output signals of the gain adjusting means from the signals of a channel 2, and a control means for inputting control starting signals, signals of the channel 2 and the outputs of the subtracting means so as to control the gains of the gain adjusting means. A song signal separator which is capable of drawing out songs only even when the recording level of the accompaniments of the channel 1 is different from the recording level of the accompaniments of the channel 2.

9 Claims, 9 Drawing Sheets

SIGNAL SEPARATOR

BACKGROUND OF THE INVENTION

The present invention generally relates to a signal separator for separating model songs in a Karaoke apparatus using a media where accompaniments only are recorded as first signals on a channel 1, and accompaniments and model songs as second signals are recorded on a channel 2.

The Karaoke apparatus is an appliance for song accompaniments developed in Japan. It is used for singing with the use of a microphone while reproducing accompanied music recorded previously on recording media. In recent years, the Karaoke apparatus has various functions of detecting the existence of the model songs recorded on the recording media so as to indicate a song starting portion, reproducing the model songs automatically when a user cannot sing continuously, because he forgets his words, displaying on picture scenes intervals of the model songs and the user's songs, and the others.

A voice multiplex Karaoke laser disk put on the market at present has voice signals of four channels recorded in total, namely, two channels of digital voices and two channels of analog voices. Two channels of digital voices have the accompaniments recorded in stereo. The L (left) channel of analog has the accompaniments only recorded, and the R (right) channel thereof has the accompaniments and the model songs recorded. The accompaniments recorded on the analog L channel, and the Right channel are the same signals.

A prior material of the conventional Karaoke apparatus provided with a function of drawing out model song signals only from the analog voices of the voice multiplex Karaoke laser disk is disclosed in the Title of the Invention, for example, "Karaoke apparatus" in Japanese Patent Laid-Open Publication No. 5-165398.

The conventional signal separator will be described hereinafter with reference to the drawings.

FIG. 14 is a block diagram showing the construction of the conventional signal separator.

In FIG. 14, reference numeral 1101 is an analog L (left) signal input terminal, reference numeral 1102 is an analog R (right) signal input terminal, reference numeral 1103 is a subtracter for subtracting L signals from R signals, reference numeral 1104 is an output input. Since the accompaniments only are recorded on the L (left) channel of the analog and the accompaniments and the model songs are recorded on the R (right) channel by the above described construction, the model song signals only are outputted to the output terminal 1104.

The above described conventional construction has a problem that only the model songs cannot be drawn out when the recording level of the accompaniments of the L signals is different from the recording level of the accompaniments of the R signals. The voice multiplex Karaoke laser disk put on the market often has the accompaniment level of the R signals lower than the accompaniment level of the L signal in order to add the model songs. The accompaniment level of the L signal and the R signal is different not only on desk, but also on each piece even in the same disk. Therefore, the conventional construction cannot damp the accompaniments sufficiently in a piece so that the function of using the model song signals may cause error operations.

SUMMARY OF THE INVENTION

Accordingly, the present invention has been developed with a view to substantially eliminating the above discussed drawbacks inherent in the prior art and has for its essential object to provide an improved signal separator.

Another important object of the present invention is to provide an improved signal separator capable of drawing out model songs only even when the recording level of the accompaniments of the L signals is different from the recording level of the accompaniments of the R signals.

In accomplishing these and other objects, according to preferred embodiments of the present invention, there is a signal separator which includes a gain adjusting means for inputting signals of a channel 1 including a first signal only, a subtracting means for subtracting the output signals of the gain adjusting means from the signals of a channel 2 including the first and second signals, and a control means for inputting control starting signals, signals of the channel 2 and the outputs of the subtracting means so as to control the gains of the gain adjusting means.

The present invention controls a gain controlling means so as to minimize the subtracter outputs by the control means in accordance with the signals of the channel 2 and the output signals of the subtracting means from the input time point of the control starting signal through the above-described construction.

BRIEF DESCRIPTION OF THE DRAWINGS

These and other objects and features of the present invention will become apparent from the following description of the preferred embodiments thereof with reference to the accompanying drawings, in which.

DETAILED DESCRIPTION OF THE EMBODIMENT

Figure 1:
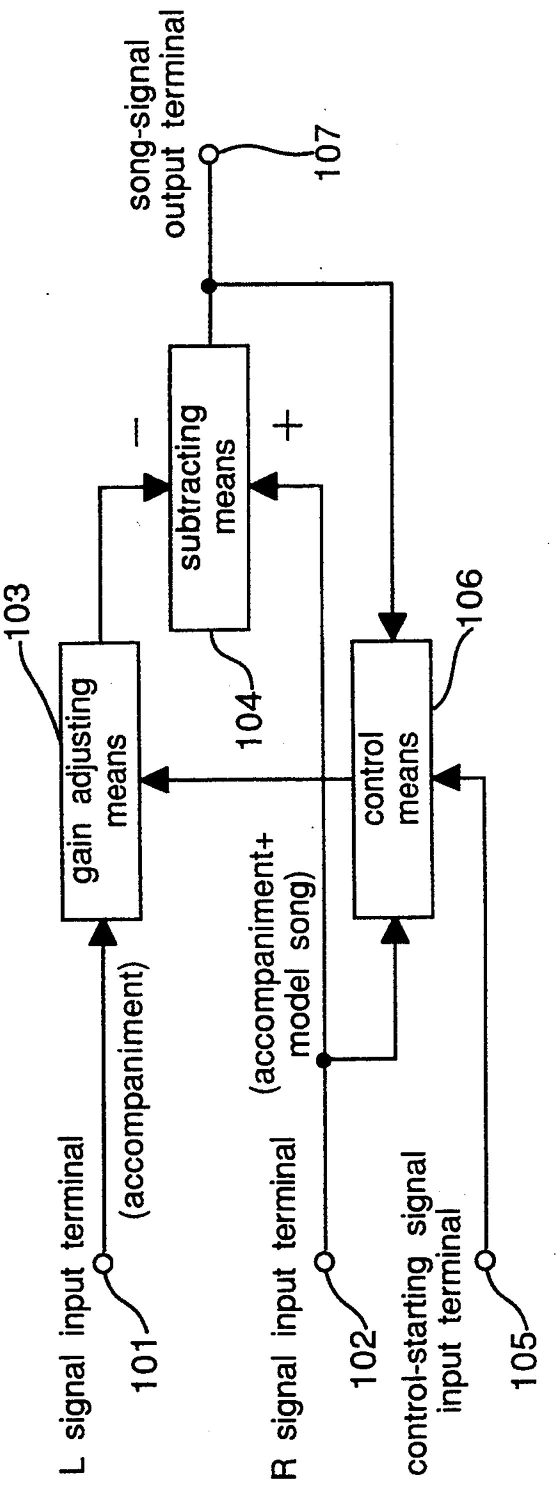
FIG. 1 is a block diagram showing the construction of a first embodiment of the present invention.

Before the description of the present invention proceeds, it is to be noted that like parts are designated by like reference numerals through the accompanying drawings.

Assume that signals of a channel 1 including only the accompaniment signals are distributed into the channel L (left) and signals of a channel 2 including the accompanying signals and the model song signals are distributed into the channel R (right) in the following first through third embodiments.

The present invention will be described hereinafter with reference to the drawings in a first embodiment. The first embodiment is an example using a controlling means described in a claim 2.

FIG. 1 is a block diagram showing the construction of the first embodiment of the present invention. Referring now to FIG. 1, reference numeral 101 is a L signal input terminal, reference numeral 102 is a R signal input terminal, reference numeral 103 is a gain adjusting means for inputting the L signals, reference numeral 104 is a subtracting means for subtracting the output signals of the gain adjusting means 103 from the R signals, reference numeral 105 is a starting signal input terminal, reference numeral 106 is a controlling means for inputting starting signals and R signals, the output signals of the subtracting means 104, reference numeral 107 is an output terminal for outputting the outputs of the subtracting means 104.

Figure 2:
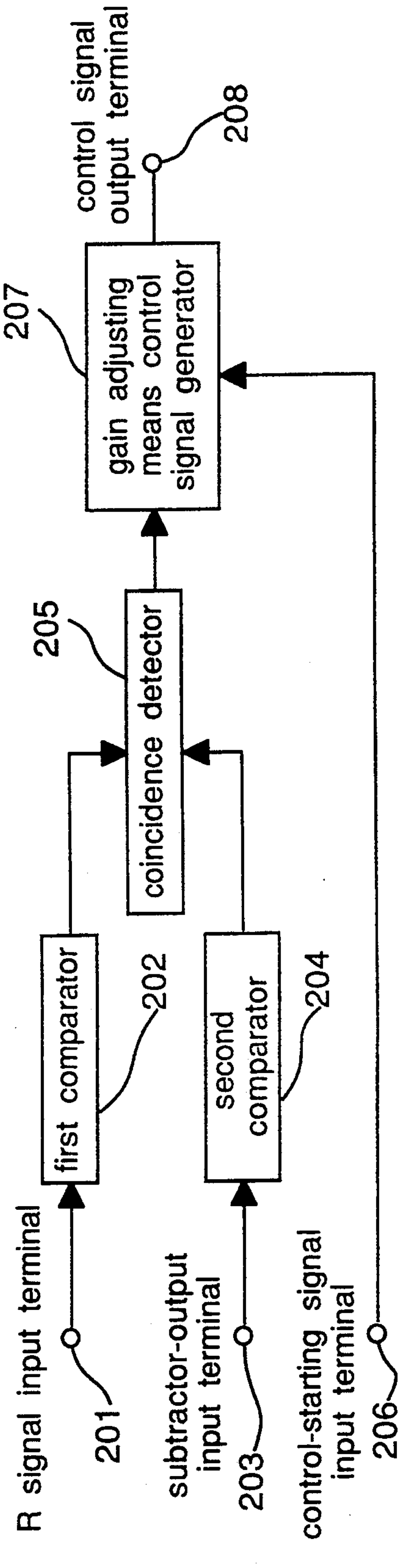
FIG. 2 is a block diagram showing the construction of a controlling means in the same embodiment.
Figure 3A:
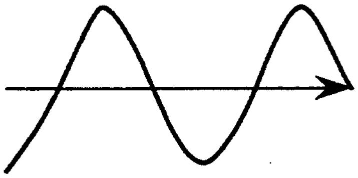
FIG. 3*a* to FIG. 3*f* are wave form charts each for explaining the principle of a gain adjusting means controlling operation in the same embodiment.
Figure 3D:
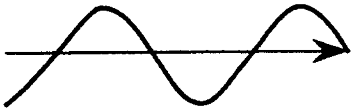
Figure 3B:
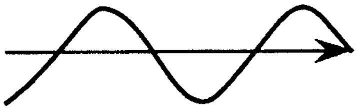
Figure 3E:
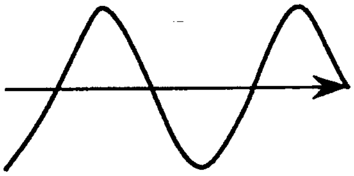
Figure 3C:
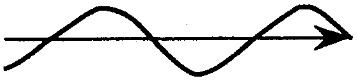
Figure 3F:
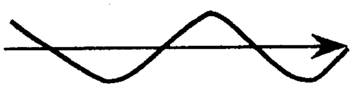

FIG. 2 is a block diagram showing the construction of the controlling means.

Referring now to FIG. 2, reference numeral 201 is a R signal input terminal, reference numeral 202 is a first comparator for comparing the R signals with a zero level, reference numeral 203 is an input terminal of the outputs of a subtracter 104, reference numeral 204 is a second comparator for comparing the outputs of the subtracting means with a zero level, reference numeral 205 is a coincidence detector for detecting the coincidence/non-coincidence between the comparison results of a first comparator and comparison results of a second comparator, reference numeral 206 is a control starting signal input terminal, reference numeral 207 is a signal generator for controlling a gain adjusting means for inputting the control starting signals and the outputs of the coincidence detector 205, reference numeral 208 is a control signal output terminal.

A signal separator in a first embodiment of the above described construction will be described hereinafter in its operation.

The Karaoke normally has a prelude portion. The prelude portion has accompaniments only even in the R signals. If the outputs of the subtracting means 10 are adapted to be generated no more by the proper control of the gain adjustment means 103 in the prelude portion, only the song signals only are outputted from the subtracting means 104 when the prelude is completed and the songs are started.

The principle of the gain adjustment means controlling operation will be described. FIG. 3 is a chart showing the relation among the R signals, the output signals of the gain adjustment means 103, the output signals of the subtracting means 104. In FIG. 3, (*a*) shows a R signal, (*b*) is an output signal of a gain adjustment means 103, (*c*) is an output signal of a subtracting means 104.

(1) is a case where the output of a gain adjusting means 103 is smaller than a R signal, and (2) is a case where the output of the gain adjusting means 103 is larger than the R signal. In the (1), the R signal (a) is the same in phase as the output signal (c) of the subtracting means 104. In the (2), the R signal (a) is opposite in phase to the output signal (c) of the subtracting means 104. The R signal is compared with a zero level by a first comparator 202 and the output of the subtracter means 104 is compared with the zero level by a second comparator so as to detect by a coincidence detector 205 the coincidence or non-coincidence between the outputs of the first subtractor and the outputs of the second comparator. In the case of the coincidence, the gain of the gain adjusting means 103 is lowered. In the case of the non-coincidence, the output of the subtracter 104 becomes smaller if the gain is raised. Repeat the above described operation by a plurality of times while making the variation of the gain small smaller, and the output of the subtracter 104 becomes smaller.

Figure 4:
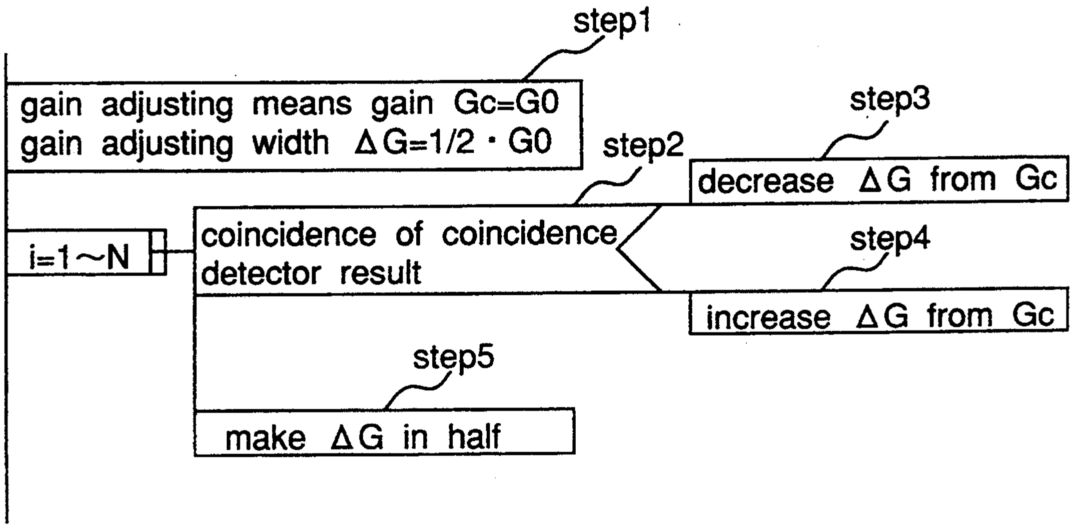
FIG. 4 is a PAD (problem analysis diagram) showing a procedure of the gain adjusting means controlling operation in the same embodiment.

Procedure of the controlling operation will be described hereinafter. FIG. 4 is a PAD (problem analysis diagram) showing a procedure of a gain adjusting means controlling operation. When the control starting signal is inputted, the gain adjustment means controlling operation starts. The gain Gc of the gain adjusting means is set to GO and the gain variation width $G_c$ is set to ½ GO (step 1). The GO is a value of ½ of the gain adjustment width of the gain adjusting means 103. Then, it is checked whether or not the outputs of the coincidence detector agree (step 2). In the coincidence thereof, the gain of the gain adjusting means is reduced by ΔG (step 3). In the non-coincidence, the gain thereof increases by ΔG (step 4). Make the gain variation width ΔG ½ (step 5). Repeat the steps 2 through 5 by N times and the gain adjustment means 103 is adjusted so that the outputs of the subtracter 103 may be minimized. The repeating frequency N depends upon the adjustment step of the gain adjusting means. If the adjusting step is 64 (8-th power of 2) stage, N becomes 8.

In the first embodiment, control the gain controlling means so that the subtracter outputs may be minimized by the controlling means 106 in accordance with the signal of the channel R and the output signals of the subtraction means 104 from the input time point of the control starting signal and the accompaniments are removed so that only the song signals may be drawn out. Since the R signal is compared with the output signal of the subtracting means 104 at the same time with the use of two comparators in the first embodiment, the controlling operation of the gain adjusting means can be effected at a high speed. The comparator has only to compare the signals in size with the zero level independently of resolution, linearity and so on.

The present invention will be described in a second embodiment hereinafter with reference to the drawings. The second embodiment is an example using a controlling means described in the claim 3.

Since the whole operation of the second embodiment is the same as that of the first embodiment, a controlling means different from that of the first embodiment will be described hereinafter.

Since the coincidence detector is used in a time division in a second embodiment, the zone of the input signals of the comparator is restricted by a low-pass filter so that influences of the shift of the comparison timings will not be received.

Figure 5:
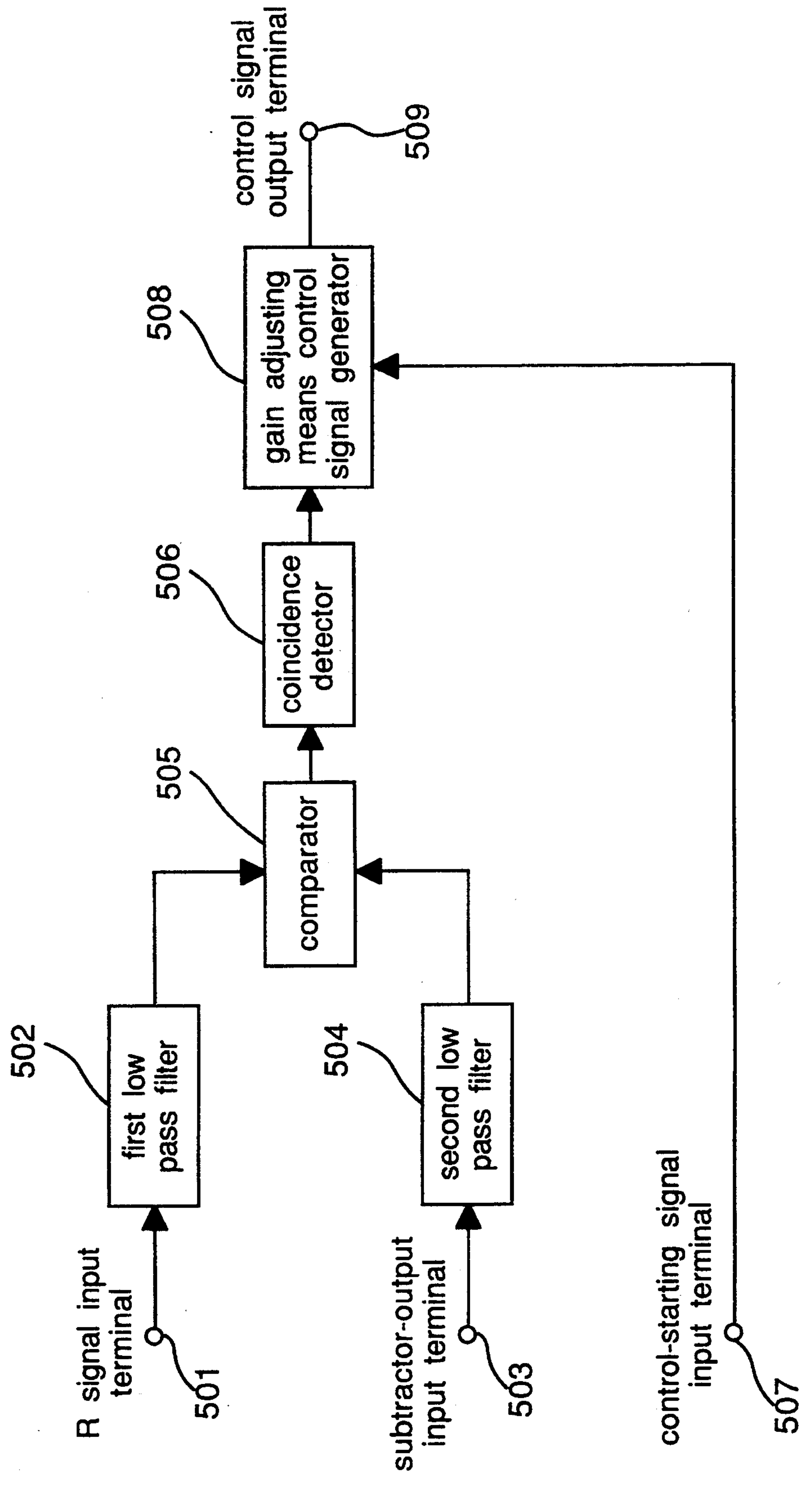
FIG. 5 is a block diagram showing the construction of a controlling means in a second embodiment.

FIG. 5 is a block diagram showing the construction of the controlling means.

Referring now to FIG. 5, reference numeral 501 is a R signal input terminal, reference numeral 502 is a low-pass filter (LPF) for inputting the R signals, reference numeral 503 is an input terminal of the outputs of the subtracter 104, reference numeral 504 is a low-pass filter (LPF) for inputting the outputs of the subtracter 104, reference numeral 505 is a comparator for inputting at time division the outputs of the first low-pass filter and the outputs of the second low-pass filter so as to compare them with the zero level, reference numeral 506 is a coincidence detector for detecting the coincidence/non-coincidence of the comparison results between the first low-pass filter and the second low-pass filter the comparator 505 outputs, reference numeral 507 is a control starting signal input terminal, reference numeral 508 is a generator for control signals of the gain adjusting means for inputting the control starting signals and the outputs of the coincidence detector 507, reference numeral 509 is a control signal output terminal.

The controlling means of the second embodiment constructed as described hereinabove will be described in its operation.

Figures 6A, 6B:
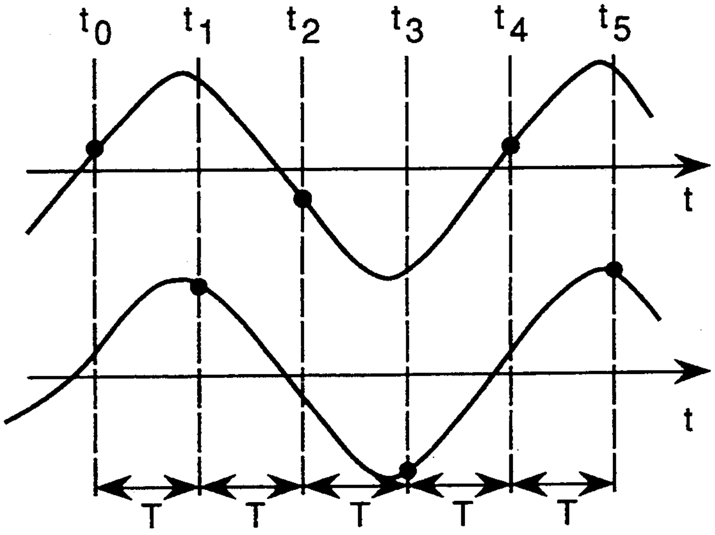
FIG. 6*a* and FIG. 6*b* are is a wave form charts each for explaining the principle of the gain adjusting means controlling operation in the same embodiment.

As described hereinabove, the low-pass filters 502, 504 are to restrict the zone of the input signals of the comparator 505. Assume that the time division interval of the comparator 505 is T [s], and the comparison results of theses signals become results not correct in the probability of the $\frac{1}{2}$ when the signal of 1/(4T) [Hz] or more is inputted in time division. FIG. 6 shows how things are effected. In FIG. 6, the (a) is an output signal of a low-pass filter 502, (b) is an output signal of a low-pass filter 504. When the comparator 505 compares the output signals of the first, second low-pass filters sequentially at times t0, t1, t2, t3, t4, . . . , the detection results of the coincidence detector 506 are correct if (t0, t1), (t2, t3) . . . are made a pair. But the detection results become wrong when the (t1, t2), (t3, t4), . . . are made a pair. The cut off frequencies of the low-pass filters 502, 503 are required to be set to sufficiently values lower than 1/(4T) [Hz].

Figure 7:
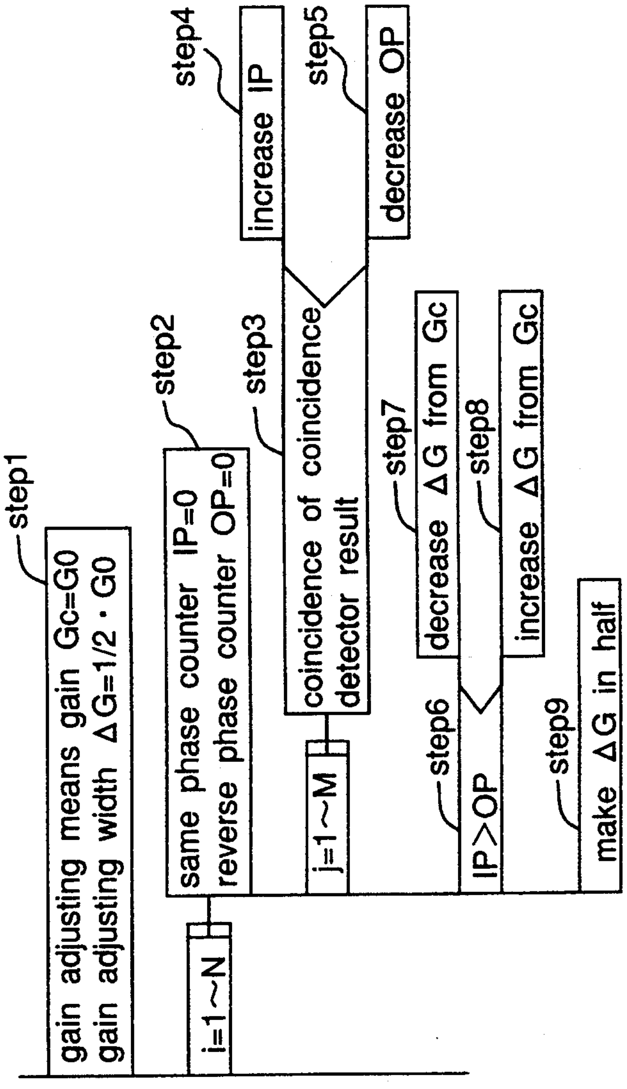
FIG. 7 is a PAD showing a procedure of the gain adjustment means controlling operation in the same embodiment.

Although the principle of the gain adjusting means control is the same as that of the first embodiment, the coincidence detections by a plurality of times are effected to prevent errors, because the detection results of the coincidence detector positively include errors. A procedure of the controlling operation for effecting a plurality of coincidence detections will be described. FIG. 7 is a PAD for showing a procedure of the gain adjusting means controlling operation. If the control starting signal is inputted, the gain Gc of the gain adjusting means is set into the GO and the gain variation width ΔG is set into $\frac{1}{2}$.GO (step 1). The GO is a value of the $\frac{1}{2}$ of the gain adjusting width of the gain adjusting means 103. Counters IP, OP for counting the same phase and the opposite phase are set initially (step 2). It is checked whether or not the outputs of the coincidence detector agrees with each other (step 3). In the coincidence, the phase counter increases by one (step 4). In the non-coincidence, the opposite phase counter increases by one (step 5). Steps 2 through 5 are repeated by M times. If the repeating times M are sufficiently large, the digital results of the same phase and the opposite phase correctly reflect the condition of the input signals of the low-pass filters 502, 504. If the digital values of the phase is larger than the digital value of the opposite phase, the gain, of the gain adjusting means is reduced by ΔG (step 6, 7). If the digital value of the opposite phase is larger, the ΔG increases (step 8). The gain variable width ΔG is made $\frac{1}{2}$ (step 9). Steps 2 through 9 are repeated by N times. The repeating times N depend upon the adjusting step of the gain adjusting means. If the adjusting step is 64 at stage, the N becomes 8.

In the second embodiment, control the gain controlling means so that the subtracter output may be minimized by the controlling means 106 in accordance with the signals of the channel R and the output signals of the subtraction means 104 from the input time point of the control starting signal and the accompaniments are removed so that only the song signals may be drawn out. When an analog/digital converter of the microcomputer is used as a comparator, the system of the second embodiment is effective as the analog/digital converter of the microcomputer uses one analog/digital converter by time division is often used.

When the digital results of the in-phase and the out-of-phase are evaluated, the reliability of the digital results may be considered lower so as to start over again the counting of the in-phase.the out-of-phase unless the difference between the digital results is a reference value PO or more. The Gc is reduced by ΔG in the case of IP+PO>OP, increased by ΔG in the case of IP<PO+ OP in the steps 6–8 of FIG. 7. In the neither case of them, the counting operation will start over again. When the frequency i of the gain adjusting operations increases, the output of the subtracting means 104 becomes smaller so that the influences of the noises are likely to receive. In this case, the frequency where the in-phase.out-of-phase appear is likely to become closer to the same number, and thus, it is required not to fall into a limitless loop by the restriction into a frequency of starting the counting operation over again.

A third embodiment of the present invention will be described hereinafter with reference to the drawings. In the third embodiment, a controlling means described in the claim 6 will be used.

Since the entire operation of the third embodiment is the same as that of the first embodiment, a controlling means different from that of the third embodiment will be described.

In the third embodiment, the level of the R signal is detected so as to prevent the error operation by the noises so that the coincidence detection results at the time point will not be reflected on the gain adjusting means controlling operation when the level is a constant value or lower.

Figure 8:
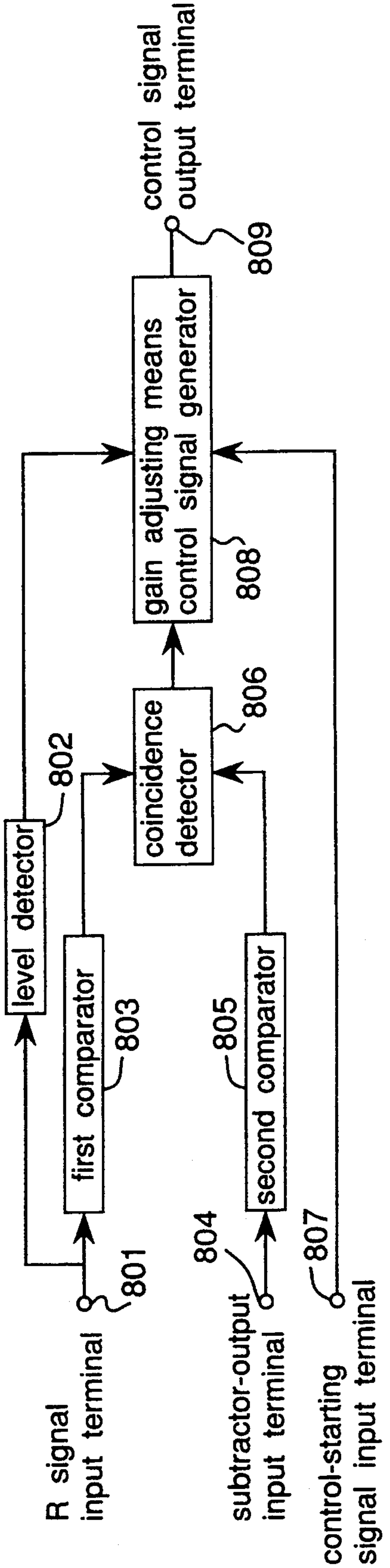
FIG. 8 is a block diagram showing the construction a controlling means in a third embodiment.

FIG. 8 is a block diagram showing the construction of a controlling means.

Referring now to FIG. 8, reference numeral 801 is a R signal input terminal, reference numeral 802 is a level detector for detecting the level of the R signal, reference numeral 803 is a first comparator for inputting R signals, reference numeral 804 is an input terminal of the outputs of the subtracter 104, reference numeral 805 is a second comparator for inputting the outputs of the subtracter 104, reference numeral 806 is a coincidence detector for detecting the coincidence/non-coincidence of the comparison results of the first comparator 803 and the comparison results of the second comparator 805, reference numeral 807 is a control starting signal input terminal, reference numeral 808 is a generator for control signals of the gain adjusting means for inputting the control starting signals, the outputs of the coincidence detector 806 and the outputs of the level detector 802.

The controlling means of a third embodiment constructed as described hereinabove will be described hereinafter in its operation.

Although the principle of the gain adjusting means controlling operation is the same as that of the first embodiment, which is different in that the coincidence detection results where the level of the R signal is detected by the level detecting means, the level is a constant value or lower will not be reflected in the gain adjusting means controlling operation.

Figure 9:
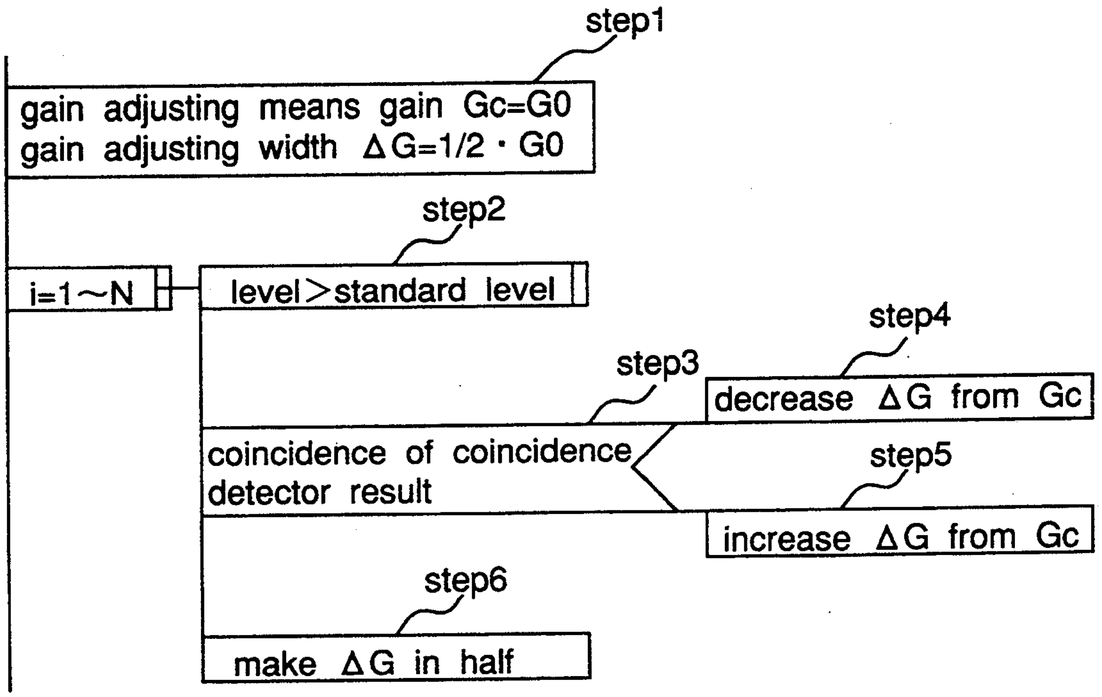
FIG. 9 is a PAD showing a procedure of the gain adjusting means controlling operation in the same embodiment.

FIG. 9 is a PAD showing the procedure of the gain adjusting means controlling operation. After the control starting signal has been inputted, the gain Gc of the gain adjusting means is set into GO, and the gain variable width ΔG will be set into ½.GO (step 1). The GO is a value of ½ of the gain adjusting width of the gain adjusting means 103. It takes in level detection result so as to check whether or not the result is larger than a constant value (level 0). When it is not larger, the level detection results take-in operation is restored again so as to loop until the level becomes a constant value or more (step 2). After passing through the loop at the step 2, it is Checked whether or not the outputs of the coincidence detector agrees (step 3). In the coincidence thereof, the gain of the gain adjusting means is reduced by $G_c$ (step 4). In the non-coincidence, the gain thereof increases by ΔG (step 5). The gain variation width $G_c$ is made ½ (step 6). Steps 2 through 5 are repeated by N times. The repeating times N depend upon the adjusting step of the gain adjusting means. Assume that, for example, the adjusting step is 64 in stage, and N becomes 8.

In the third embodiment, control the gain controlling means so that the subtracter output may be minimized by the controlling means 106 in accordance with the signals of the channel R and the output signals of the subtraction means 104 from the input time point of the control starting signal and the accompaniments are removed so that only the song signals may be drawn out. Especially, in the third embodiment, a waiting loop comes when the level detection is effected and at a constant level or lower, so that error actions are not caused in a case where the starting signals come earlier than the prelude, minute sound portions are included in the prelude or the like.

In a fourth embodiment of the present invention, it will be described hereinafter with reference to the drawings. The fourth embodiment is an example using a control means described in the claim 4.

Since the entire operation of the fourth embodiment is the same as that of the first embodiment, a control means different from that of the first embodiment will be described hereinafter.

Figure 10:
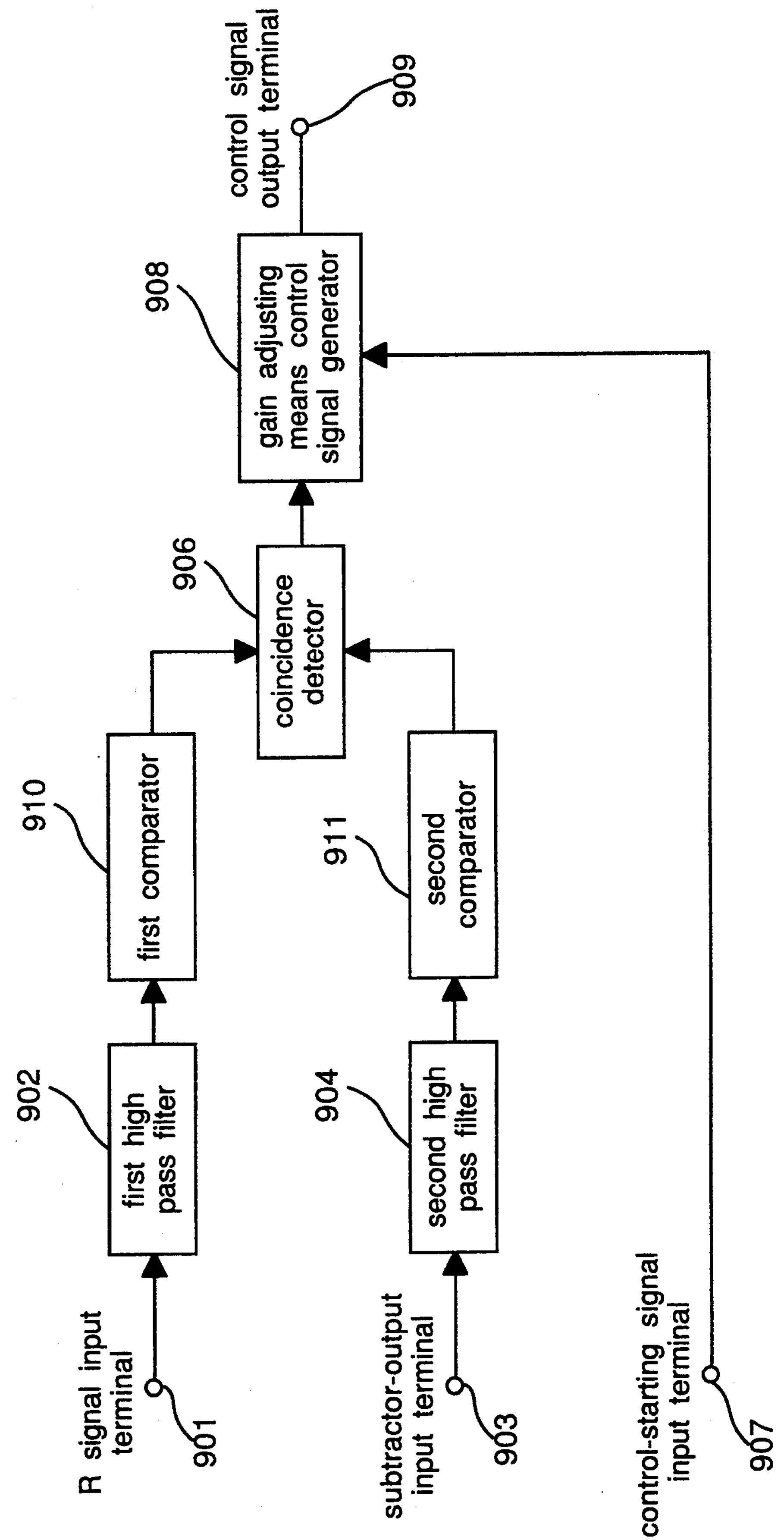
FIG. 10 is a block diagram showing the construction of the controlling means in a fourth embodiment.

FIG. 10 is a block diagram showing the construction of the control means.

In FIG. 10, reference numeral 901 is a R signal input terminal, reference numeral 902 is a first high-pass filter (HPF) for inputting the F signals, reference numeral 903 is an input terminal of the outputs of the subtracter 104, reference numeral 504 is a second high-pass filter (HPF) for inputting the outputs of the subtracter 104, reference numeral 910 is a first comparator for comparing the outputs of the first HPF with the zero level, reference numeral 911 is a second comparator for comparing the outputs of the first HPF with the zero level, reference numeral 906 is a coincidence detector for detecting the coincidence/non-coincidence between the comparison results of the first comparator 910 and the comparison results of the second comparator 911, reference numeral 907 is a control starting signal input terminal, reference numeral 908 is a gain adjusting means controlling signal generator for inputting the control starting signals and the outputs of the coincidence detector 907, reference numeral 909 is a control signal output terminal.

The controlling means of the fourth embodiment constructed as described hereinabove will be described hereinafter in this operation.

The HPF 902, 904 are to restrict the frequency band of the input signal of the comparator 905 as described hereinabove.

When the dynamic range of the input of the comparator 905 is narrower as compared with the dynamic range of the R signal, the gain adjusting means 103 can be positively adjusted no longer. As a result, the accompaniments cannot be sufficiently damped, thus causing a case where the model song signals only cannot be outputted. For example, when a MN18888 microcomputer made by the Matsushita Electronic Industry is used as a comparator 905, a built-in analog/digital converter uses 8 bits. The dynamic range is narrow by 8 bits although the R signal uses 16 bits. How to narrow the wide signals of the dynamic range will be described hereinafter.

Figure 11A:
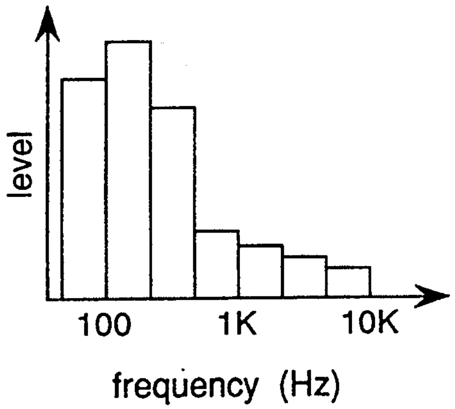
FIG. 11*a* and FIG. 11*b* shows the results of a frequency analysis of a signal.
Figure 11B:
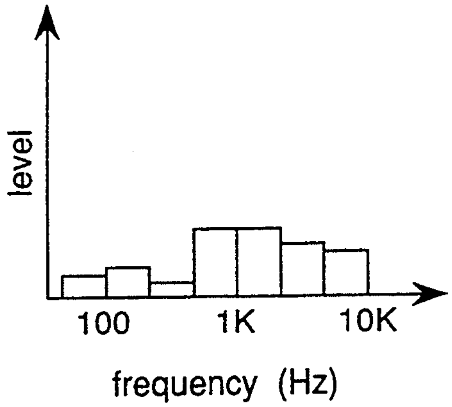
Figure 12A:
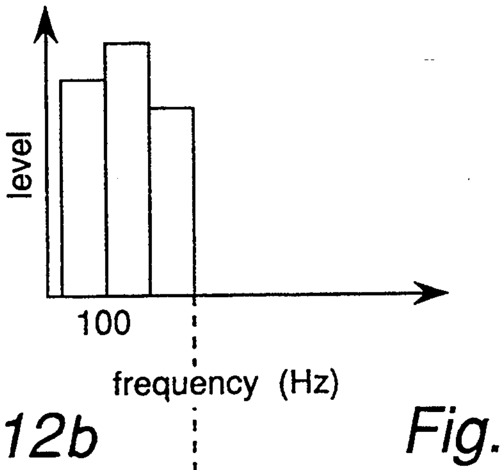
FIG. 12*a*, FIG. 12*b*, FIG. 12*c* and FIG. 12*d* show results of the frequency analysis of a signal where a signal is separated by LPF and HPF.
Figure 12C:
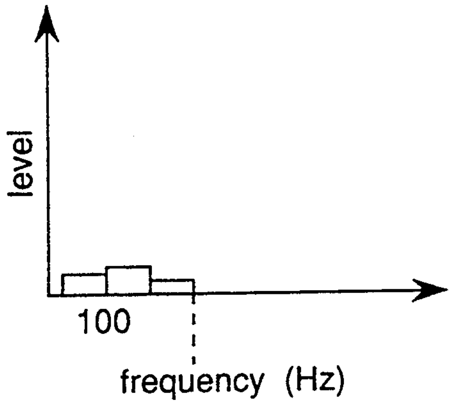
Figure 12B:
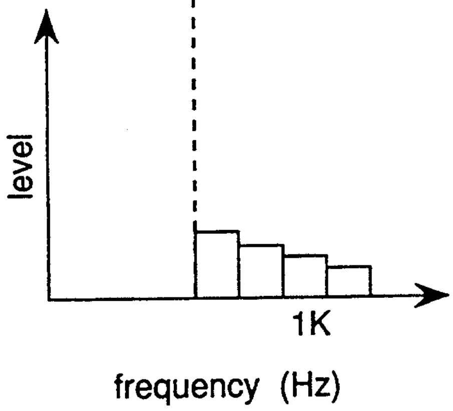
Figure 12D:
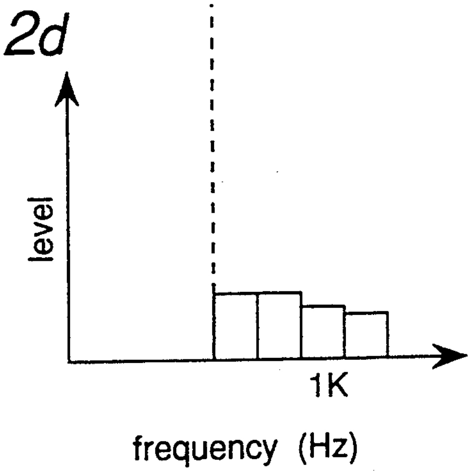

FIG. 11 shows an example of the results where the R signal is analyzed by a frequency. The axis of abscissas is a frequency and the axis of ordinates is a level. (*a*) is an example of a time point where bass musical instrument such as bass or the like is played and (*b*) is an example of a time point where the bass musical instrument is not performed. It is found out from the graph that the components of the low frequency band, instead of the components of middle frequency band through high frequency band, chiefly decide the size of the dynamic range. FIG. 12 shows results where a signal separated into two channel signal by HPF and LPF is analyzed by frequency with respect to the same signal shown in FIG. 11. The (*a*), (*b*) of FIG. 12 is the signal the same as that of FIG. 11. (1) shows a case of the output signal of the LPF and the (2) is a case of the output signal of the HPF. It is found out from the results of FIG. 12 that the dynamic range can be apparently narrowed by the HPF in a signal wide in the dynamic range decided chiefly by the components of the low frequency band and bad influences are not given even in the narrow signal in dynamic. The dynamic range of the R signal and the output of the subtracter 104 can be narrowed in accordance with the narrow dynamic range comparator 905 by the first HPF 902 and the second HPF 904 shown in FIG. 10. Each signal level can be controlled before a controlling operation of adjusting the gain adjusting means 103 is suspended by the smaller operation of each signal level than the threshold of the inputs of the comparator 905. As a result, the accompaniments can be sufficiently damped and only the model song signals can be outputted.

How to decide the cut off frequency value of the first and second HPF 1002 and 1005 will be concretely described by way of the same MN 18888 made by the Matsushita Electronic Industry as a microcomputer having 8-bit analog/digital converter. Distortion may be caused so as to cause error actions in the input signals because of different quantization number in the conditions where the R signals of 16 bits are connected as the inputs of the 8-bit analog/digital converter. Therefore, it is necessary to make the dynamic range equal.

The fifth embodiment of the present invention will be described hereinafter with reference to the drawings. The fifth embodiment is an example using the controlling means described in the first embodiment.

Since the entire operation of the fifth embodiment is the same as that of the first embodiment, a controlling means different from that of the first embodiment will be described.

Figure 13:
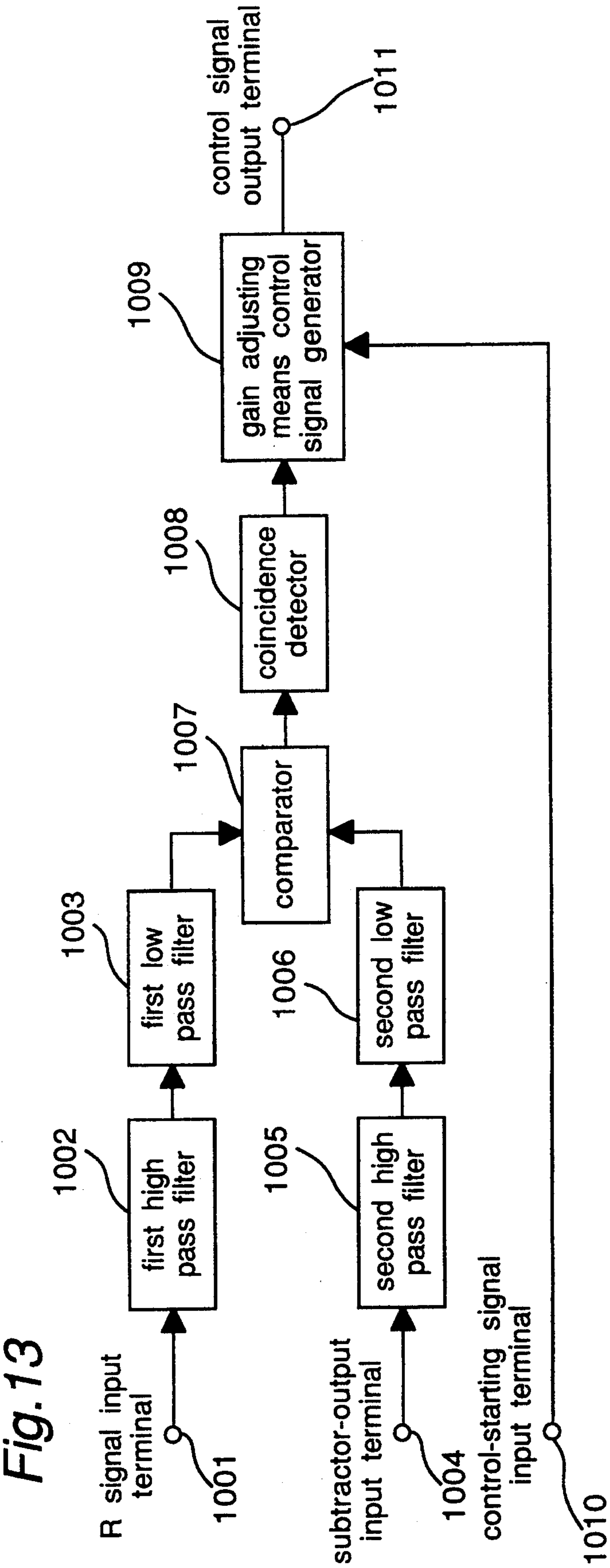
FIG. 13 is a block diagram showing the construction of a controlling means in a fifth embodiment.
Figure 14:
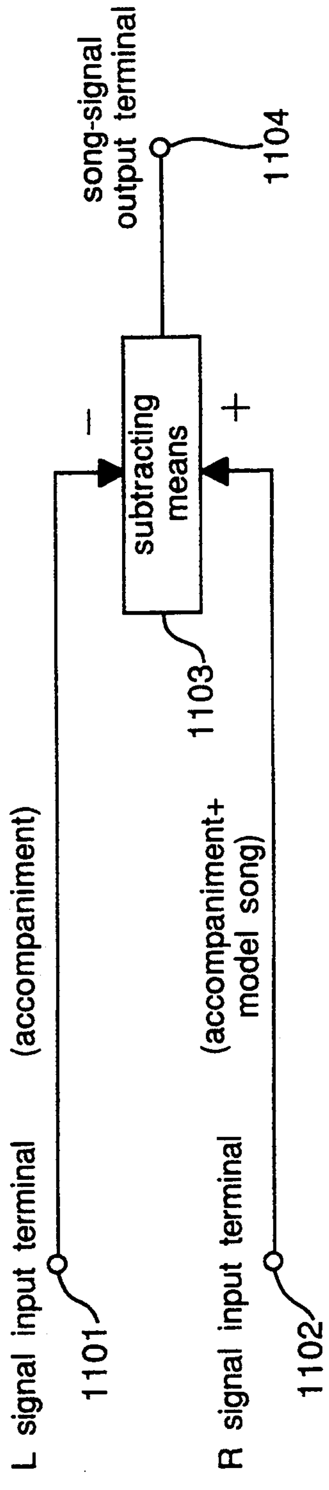
FIG. 14 is a block diagram showing the construction of the conventional signal separating apparatus.

FIG. 13 is a block diagram showing the construction of the controlling means.

Referring now to FIG. 13, reference numeral 1001 is a R signal input terminal, reference numeral 1002 is a first HPF for inputting R signals, reference numeral 1003 is a first LPF for inputting the outputs of the first HPF 1002, reference numeral 1004 is an input terminal of the outputs of a subtracter 104, reference numeral 1005 is a second HPF for inputting the outputs of the subtracter 104, reference numeral 1006 is a second LPF for inputting the outputs of the second HPF 1005, reference numeral 1007 is a comparator for inputting in time division the outputs of the first LPF 1003 and the outputs of the second LPF so as to compare them with a zero level, reference numeral 1008 is a coincidence detector for detecting the coincidence/non-coincidence between the comparison results of the outputs of the first LPF and the comparison results of the second LPF the comparator 1007 outputs, reference numeral 1010 is a control starting signal input terminal, reference numeral 1009 is a gain adjusting means controlling signal generator for inputting the control starting signals and the outputs of the coincidence detector 1008, reference numeral 1011 is a control signal output terminal.

The controlling means of the first embodiment constructed as described hereinabove will be described hereinafter in its operation.

The first and second HPF 1002, 1005 can narrow the wide signals of the dynamic range to be chiefly determined by the components of the low frequency band as described already. The first and second LPF 1003, 1006 can prevent the operation in a case where one analog/digital converter of the microcomputers is used in time division as a comparator as described already.

How to decide the cut off frequency values of the first and second LPF 1003, 1006 will be described concretely by way of MN 18888 made by the Matsushita Electronic Industry as a microcomputer provided with a 8-bit analog/digital converter. When a section capable of the analog/digital converter is 32$\mu$ seconds and two outputs of the first and second LPF 1003, 1006 are made input signals, the time division interval (T) becomes 16$\mu$ seconds at maximum. The cut off frequency of the first and second LPF 1003, 1006 are required to be set to a value sufficiently lower than the 1/(4T) as described hereinabove and the cut off frequency becomes 3.1 KHz when, for example, the sufficiently low value has been set to 1/5.

How to decide the cut off frequency value of the first and second HPF 1002, 1005 will be described hereinafter. A frequency band for widening the dynamic range as described in FIG. 11 is 1 KHz or lower and the cut off frequency of the first and second HPF 1002, 1005 have only to be set to 1 KHz or lower. The cut off frequency of the first and second HPF 1002, 1005 have only to be set to a value smaller than the cut off frequency. The dynamic range of the R signal and the subtracter 104 outputs can be made narrower in accordance with the comparator 1007 of the narrow dynamic range by the first HPF 1002 and the second HPF 1005 shown in FIG. 13 so that the influences of the shift of the comparison timing of the comparator 1007 can be avoided by the first and second LPF 1003, 1006. As a result, the accompaniments can be sufficiently damped and only the model songs signals can be outputted.

The invention has an effect superior in practical use so that the accompaniments can be removed, and only the song signals can be drawn out with precision by the controlling operation by the gain control means so that the subtracter outputs may be made minimum by the controlling means in accordance with the signals of the channel R and the outputs signals of the subtracting means from the input time point of the control starting signal.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A signal separator for separating model songs in a Karaoke apparatus using a media where accompaniments only are recorded as first signals on a channel 1, and accompaniments and model songs as second signals are recorded on a channel 2, comprising a gain adjusting means for inputting signals of the channel 1 including a first signal only, a subtracting means for subtracting the output signals of the gain adjusting means from the signals of the channel 2 including the first and second signals, and a control means for inputting signals of the channel 2, the outputs of the subtracting means, and a control starting signal so as to control the gain of the gain adjusting means.

2. A signal separator as defined in claim 1, where the control means comprises a first comparator for comparing signals of channel 2 with a zero level, a second comparator for comparing the output of a subtracting means with a zero level, a coincidence detector for detecting coincidence/non-coincidence between the comparison results of the first comparator and the comparison results of the second comparator, a gain adjusting means controlling signal generator for inputting the outputs of the coincidence detector so as to reduce gain upon detection of coincidence of the first and second comparator outputs by the coincidence detector, for generating a gain adjusting means controlling signal to increase gain, upon detection of non-coincidence, and to start, responsive to a control starting signal, a repetitive operation of conducting gain adjustment a plurality of times.

3. A signal separator as defined in claim 1, where the control means comprises a first low-pass filter for inputting signals of the channel 2 and a second low-pass filter for inputting the outputs of a subtracting means, a comparator for inputting the outputs of the first and second low-pass filters in time division so as to compare them with a zero level, a coincidence detector for detecting the coincidence/non-coincidence between the comparison results of the outputs of the first low-pass filter and the comparison results of the second low-pass filter, a gain adjusting means controlling signal generator for inputting the outputs of the coincidence detector so as to reduce gain upon detection of coincidence of the outputs of the first and second comparators by the coincidence detector, or for generating a gain adjusting means controlling signal to increase gain, upon detection of non-coincidence, and to start, responsive to a control starting signal, a repetitive operation of conducting gain adjustment a plurality of times.

4. A signal separator as defined in claim 1, where the control means comprises a level detector for detecting a level of the signals of channel 2, and where the controlling means comprises a first high-pass filter for inputting signals of the channel 2 and a second low-pass filter for inputting the outputs of a subtracting means, a first comparator for comparing the outputs of the first high-pass filter with the zero level, a second comparator for comparing the outputs of the second high-pass filter with the zero level, a coincidence detector for detecting the coincidence/non-coincidence between the comparison results of the first comparator and the comparison results of the second comparator, a gain adjusting means controlling signal generator for inputting the outputs of the coincidence detector, when the level detected by the level detector is at least a threshold value, so as to reduce gain upon detection of coincidence of the first and second comparator outputs by the coincidence detector, or for generating a gain adjusting means controlling signal to increase gain, upon detection of non-coincidence, and to start, responsive to a control starting signal, a repetitive operation of conducting gain adjustment a plurality of times.

5. A signal separator as defined in claim 1, where the control means comprises a concatenated first low-pass filter for inputting signals of a channel 2 and a first high-pass filter which has a cut off frequency smaller than the cut off frequency of the first low-pass filter, a second concatenated low-pass filter for inputting the outputs of the subtracting means and a second high-pass filter which has a cut off frequency which is smaller than the cut off frequency of the second low-pass filter, a comparator for inputting in time division either of the outputs of the first low-pass filter and the first high-pass filter, and either of the outputs of the second low-pass filter and the second high-pass filter so as to compare them with a zero level, a coincidence detector for detecting the coincidence/non-coincidence between the comparison results in outputs of the first low-pass filter and the comparison results in outputs of the second low-pass filter, a gain adjusting means controlling signal generator for inputting the outputs of the coincidence detector so as to reduce the gain upon detection of coincidence of the first and second comparator outputs by the coincidence detector, or for generating a gain adjusting means controlling signal to increase gain, upon detection of non-coincidence, and to start, responsive to a control starting signal, a repetitive operation of conducting gain adjustment a plurality of times.

6. A signal separator as defined in claim 1, where the control means comprises a level detector for detecting a level of the signals of channel 2, a first comparator for comparing signals of channel 2 with a zero level, a second comparator for comparing the outputs of a subtracting means with a zero level, a coincidence detector for detecting coincidence/non-coincidence between the comparison results of the first comparator and the comparison results of the second comparator, a gain adjusting means controlling signal generator for inputting the outputs of the coincidence detector when the level detected by the level detector is at least a threshold value so as to reduce gain upon detection of coincidence of the first and second comparator outputs by the coincidence detector, or for generating a gain adjusting means controlling signal to increase the gain, upon detection of non-coincidence, and to start, responsive to a control starting signal, a repetitive operation of conducting gain adjustment a plurality of times.

7. A signal separator as defined in claim 1, where the control means comprises a level detector for detecting the level of the signals of the channel 2, a first low-pass filter for inputting signals of the channel 2, a second low-pass filter for inputting the outputs of a subtracting means, a comparator for inputting the outputs of the first and second low-pass filters in time division so as to compare them with a zero level, a coincidence detector for detecting the coincidence/non-coincidence between the comparison results of the outputs of the first low-pass filter and the comparison results of the second low-pass filter the comparator outputs, a gain adjusting means controlling signal generator for inputting the outputs of the coincidence detector, when the level detected by the level detector is at least a threshold value, so as to reduce gain upon detection of coincidence of the first and second comparator outputs by the coincidence detector, or for generating a gain adjusting means controlling signal to increase gain, upon detection of non-coincidence, and to start, responsive to a control starting signal, a repetitive operation of conducting gain adjustment a plurality of times.

8. A signal separator as defined in claim 1, where the control means comprises a level detector for detecting the level of the signals of channel 2, a first high-pass filter for inputting signals of channel 2, a second high-pass filter for inputting the outputs of a subtracting means, a first comparator for comparing the outputs of the first high-pass filter with the zero level, a second comparator for comparing the outputs of the second high-pass filter with the zero level, a coincidence-detector for detecting the coincidence/non-coincidence between the comparison results of the first comparator and the comparison results of the second comparator, a gain adjusting means controlling signal generator for inputting the outputs of the coincidence detector, when the level detected by the level detector is at least a threshold value, so as to reduce gain upon detection of coincidence of the first and second comparator outputs by the coincidence detector, or for generating a gain adjusting means controlling signal to increase gain, upon detection of non-coincidence, and to start, responsive to a control starting signal, a repetitive operation of conducting gain adjustment a plurality of times.

9. A signal separator as defined in claim 1, where the control means comprises a level detector for detecting the level of the signals of channel 2, a concatenated first low-pass filter for inputting signals of channel 2 and a first high-pass filter which is a cut off frequency smaller than the cut off frequency value of the first low-pass filter, a second concatenated low-pass filter for inputting the outputs of the subtracting means and a second high-pass filter which is a cut off frequency which is smaller than the cut off frequency of the second low-pass filter, a comparator for inputting in time division either of the outputs of the first low-pass filter or the first high-pass filter, and either of the outputs of the second low-pass filter or the second high-pass filter so as to compare them with a zero level, a coincidence detector for detecting the coincidence/non-coincidence between the comparison results in outputs of the first low-pass filter and the comparison results of the second low-pass filter, a gain adjusting means controlling signal generator for inputting the outputs of the coincidence detector so as to reduce gain upon detection of coincidence of the first and second comparator outputs by the coincidence detector, or for generating a gain adjusting means controlling signal to increase gain, upon detection of non-coincidence, and to start, responsive to a control starting signal, a repetitive operation of conducting gain adjustment a plurality of times.

* * * * *